(12) United States Patent
Su et al.

(10) Patent No.: US 8,405,441 B2
(45) Date of Patent: Mar. 26, 2013

(54) LATCH CIRCUITRY AND METHODS OF OPERATING LATCH CIRCUITRY

(75) Inventors: Chien-Kuo Su, Luzhu Township (TW); Yi-Tzu Chen, Hsinchu (TW); Chung-Cheng Chou, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 71 days.

(21) Appl. No.: 13/070,868

(22) Filed: Mar. 24, 2011

(65) Prior Publication Data

US 2012/0242388 A1 Sep. 27, 2012

(51) Int. Cl.
*H03K 3/356* (2006.01)

(52) U.S. Cl. ......... 327/208; 327/214; 327/218; 326/93; 326/95; 326/97

(58) Field of Classification Search ............. 327/208, 327/214, 218; 326/93, 95, 97
See application file for complete search history.

(56) References Cited

U.S. PATENT DOCUMENTS

| 5,867,049 A * | 2/1999 | Mohd ............... 327/200 |
| 6,794,916 B1 * | 9/2004 | Varma ............... 327/218 |
| 2008/0180139 A1 * | 7/2008 | Natonio et al. ....... 327/117 |

* cited by examiner

*Primary Examiner* — John Poos
(74) *Attorney, Agent, or Firm* — Lowe Hauptman Ham & Berner, LLP (57) ABSTRACT

A latch circuit includes an output driver electrically coupled with a circuit. The circuit is electrically coupled with the output driver through a first path and a second path. The circuit is configured to receive a data signal. The circuit is configured to divert a signal of the output driver through the first path at a falling edge of the data signal. The circuit is configured to divert the signal of the output driver through the second path at a rising edge of the data signal.

19 Claims, 8 Drawing Sheets

LATCH CIRCUITRY AND METHODS OF OPERATING LATCH CIRCUITRY

TECHNICAL FIELD

The present disclosure relates generally to the field of semiconductor circuits, and more particularly, to latch circuits and methods of operating latch circuits.

BACKGROUND

A latch is a circuit that is configured to store signal information of an integrated circuit. For example, a latch can be a bi-stable multi-vibrator that can sustain two stable states that are opposite to each other. Conventionally, a latch has a feedback loop, such that signal information can be retained by the device. As the name suggests, latches are used to "latch onto" information and hold that information in place.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

A latch circuit known to the inventors has a single inverter electrically coupled to an output driver through a single electrical path. Through the single electrical path, the inverter is directly connected to gates of a P-type transistor and an N-type transistor of the output driver. A single storage node is between the inverter and the output driver. A feedback loop is electrically connected to the storage node.

During a transparent period, the feedback loop is closed. A rising or falling edge of a data signal entering into an input node of the latch circuit is passed to the inverter. The inverter, depending on the transition of the data signal, diverts the signal of the P-type transistor or the N-type transistor of the output driver through the single electrical path. Applicants found that during the transparent period the latch circuit sees both gate capacitances of the P-type transistor and the N-type transistor. The gate capacitances result in two gate-delays from the input node to the output node of the latch circuit. The gate delays impact the operating speed of the latch circuit.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

Figure 1:
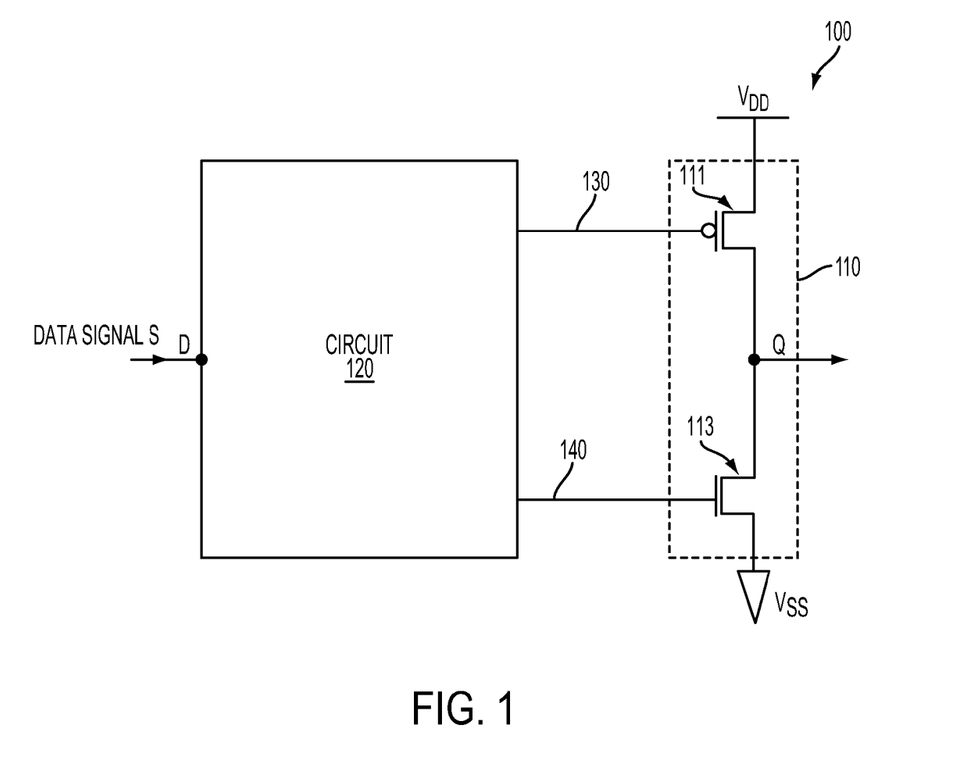
FIG. 1 is a schematic drawing illustrating an exemplary latch circuit.

FIG. 1 is a schematic drawing illustrating an exemplary latch circuit. In FIG. 1, a latch circuit 100 can include an output driver 110 that is electrically coupled with a circuit 120. The circuit 120 can be electrically coupled with the output driver 110 through paths 130 and 140. The circuit 120 can be configured to receive a data signal S at an input node D of the latch circuit 100. The circuit 120 can be configured to divert a signal $S_{out}$ of the output driver 110 through the path 130 at a falling edge of the data signal S. The circuit 120 can be configured to divert the signal $S_{out}$ of the output driver 110 through the path 140 at a rising edge of the data signal S.

In some embodiments, the output driver 110 can include a P-type transistor 111 and an N-type transistor 113 as shown in FIG. 1. A gate of the P-type transistor 111 can be electrically coupled with the circuit 120 through the path 130. A gate of the N-type transistor 113 can be electrically coupled with the circuit 120 through the path 140. A source of the P-type transistor 111 can be electrically coupled with a power source, e.g., a power source $V_{DD}$. A source of the N-type transistor 113 can be electrically coupled with a power source, e.g., a power source $V_{SS}$. Drains of the P-type transistor 111 and the N-type transistor 113 can be electrically coupled with each other and an output node Q of the latch circuit 100.

In some embodiments, the circuit 120 can be configured to divert the signal $S_{out}$ of the output driver 110 through the path 130 at a falling edge of the data signal S. For example, the circuit 120 can be configured to switch the P-type transistor 111 of the output driver 110 through the path 130 at a falling edge of the data signal S. In other embodiments, the circuit 120 can be configured to divert the signal $S_{out}$ of the output driver 110 through the path 140 at a rising edge of the data signal S. For example, the circuit 120 can be configured to switch the N-type transistor 113 of the output driver 110 through the path 140 at a rising edge of the data signal S.

Figure 2:
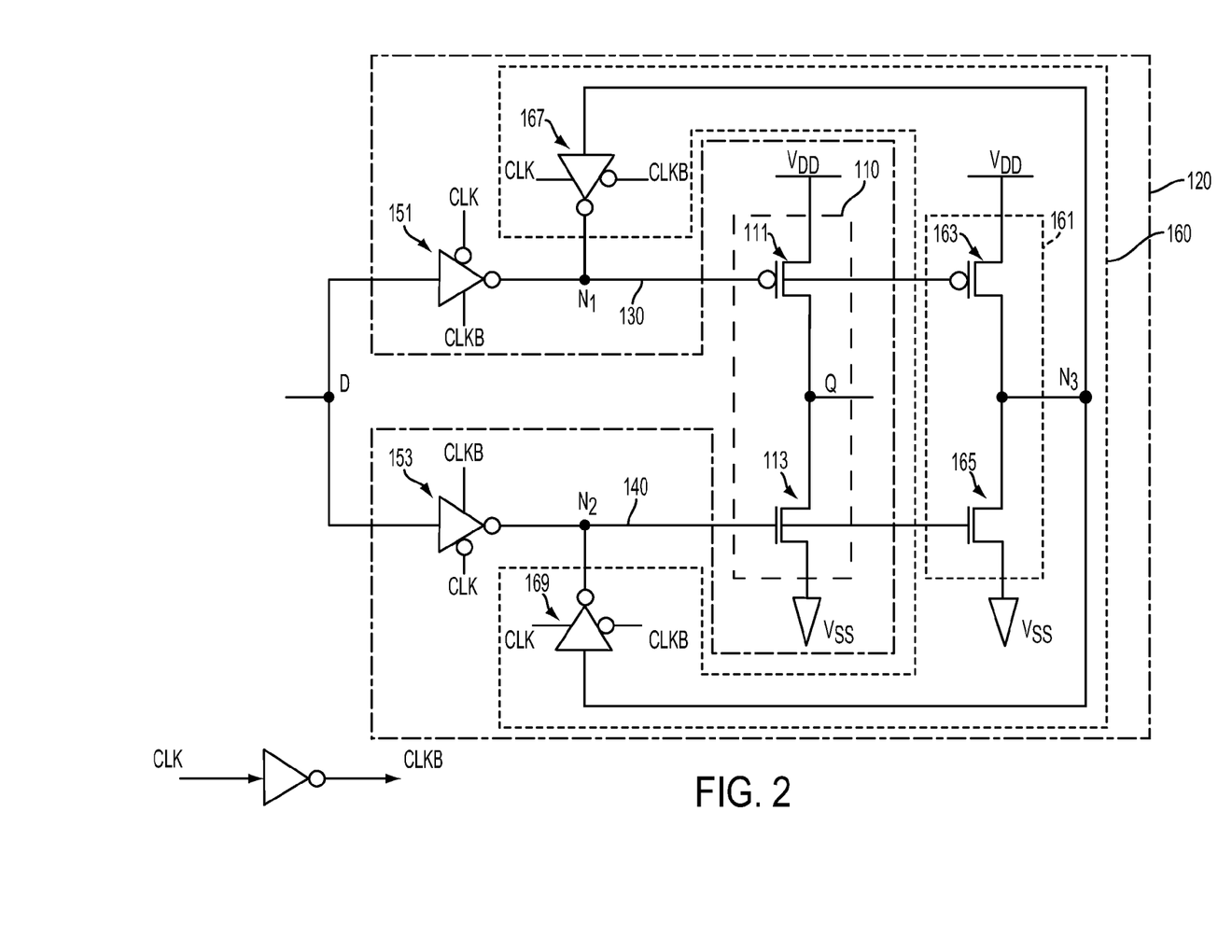
FIG. 2 is a schematic drawing illustrating another exemplary latch circuit.

FIG. 2 is a schematic drawing illustrating another exemplary latch circuit. In FIG. 2, the circuit 120 can include inverters 151 and 153 and a feedback loop 160. The inverter 151 can be electrically coupled with the output driver 110 through the path 130. A storage node $N_1$ is between the inverter 151 and the output driver 110. The inverter 153 can be electrically coupled with the output driver 110 through the path 140. Another storage node $N_2$ is between the inverter 153 and the output driver 110. The feedback loop 160 can be electrically coupled with the storage nodes $N_1$ and $N_2$. In some embodiments, the circuit 120 is configured to latch a low voltage state, e.g., "0", on the storage node during $N_1$ during a latch phase. The circuit 120 can be configured to latch a high voltage state, e.g., "1", on the storage node $N_2$ during another latch phase.

In some embodiments, the inverters 151 and 153 can each be a tri-state inverter. Input nodes (not labeled) of the inverters 151 and 153 can be electrically coupled with the input node D of the latch circuit 100. Output nodes of the inverter 151 and 153 can be electrically coupled with the gates of the P-type transistor 111 and the N-type transistor 113 through the paths 130 and 140, respectively. The inverters 151 and 153 can receive clock signals CLK and CLKB for controlling the inverters 151 and 153.

Referring to FIG. 2, in some embodiments the feedback loop 160 can include inverters 161, 167 and 169. In some embodiments, the inverter 161 can be a keeper. The inverter 161 can include a P-type transistor 163 and an N-type transistor 165. A source of the P-type transistor 163 can be electrically coupled with a power source, e.g., a power source $V_{DD}$. A source of the N-type transistor 165 can be electrically coupled with a power source, e.g., a power source $V_{SS}$. Drains of the P-type transistor 163 and the N-type transistor 165 can be electrically coupled with each other. A node $N_3$ is between the P-type transistor 163 and the N-type transistor 165.

Gates of the P-type transistor 163 and the N-type transistor 165 can be electrically coupled with the storage nodes $N_1$ and $N_2$, respectively. In some embodiments, the inverters 167 and 169 can each be a tri-state inverter. The inverter 167 can be electrically coupled between the storage node $N_1$ and the node $N_3$ between the P-type transistor 163 and the N-type transistor 165. The inverter 169 can be electrically coupled between the storage node $N_2$ and the node $N_3$ between the P-type transistor 163 and the N-type transistor 165.

Figure 3A:
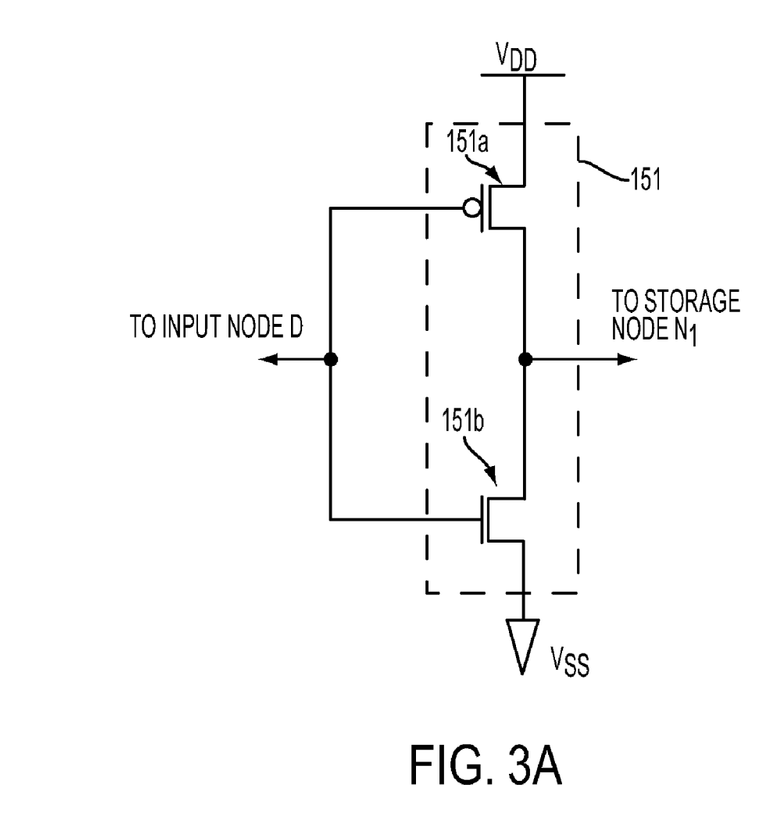
FIGS. 3A and 3B are schematic drawings illustrating exemplary inverters deployed in an exemplary latch circuit.

In some embodiments, the inverter 151 can include a P-type transistor 151a and an N-type transistor 151b as shown in FIG. 3A. Gates of the P-type transistor 151a and the N-type transistor 151b can be electrically coupled with the input node D of the latch circuit 100. A source of the P-type transistor 151a can be electrically coupled with a power source, e.g., a power source $V_{DD}$. A source of the N-type transistor 151b can be electrically coupled with a power source, e.g., a power source $V_{SS}$. Drains of the P-type transistor 151a and the N-type transistor 151b can be electrically coupled with each other and the storage node $N_1$. In some embodiments, the N-type transistor 151b has a driving ability larger than that of the P-type transistor 151a. For example, a channel width of the N-type transistor 151b is larger than that of the P-type transistor 151a. If a low-to-high voltage state transition occurs on the input node D, the N-type transistor 151b is turned on. A large current can flow through the turned-on N-type transistor 151b, desirably pulling down the voltage level on the storage node $N_1$ to the power source $V_{SS}$.

Figure 3B:
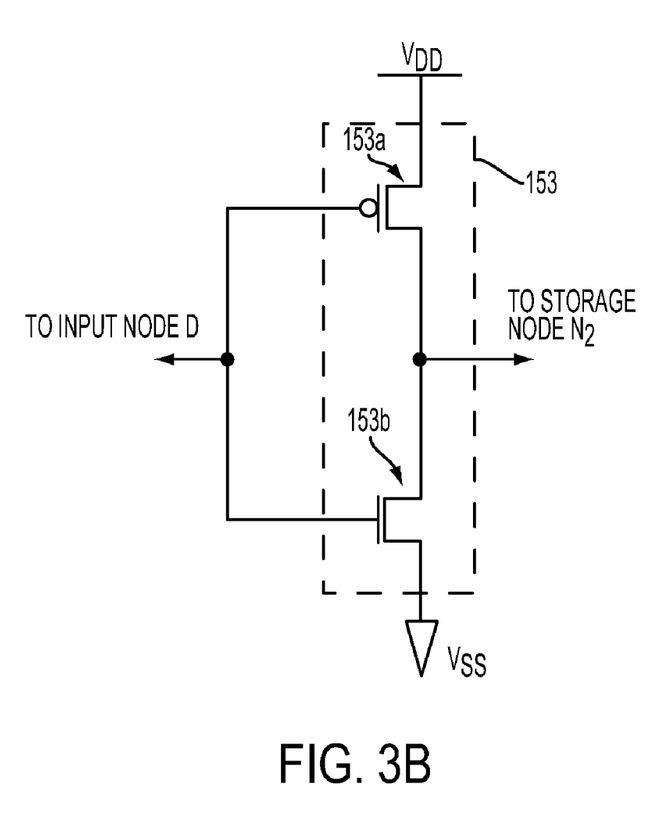

In some embodiments, the inverter 153 can include a P-type transistor and 153a and an N-type transistor 153b as shown in FIG. 3B. Gates of the P-type transistor 153a and the N-type transistor 153b can be electrically coupled with the input node D of the latch circuit 100. A source of the P-type transistor 153a can be electrically coupled with a power source, e.g., a power source $V_{DD}$. A source of the N-type transistor 153b can be electrically coupled with a power source, e.g., a power source $V_{SS}$. Drains of the P-type transistor 153a and the N-type transistor 153b can be electrically coupled with each other and the storage node $N_2$. In some embodiments, the P-type transistor 153a has a driving ability larger than that of the N-type transistor 153b. For example, a channel width of the P-type transistor 153a is larger than that of the N-type transistor 153b. If a high-to-low voltage state transition occurs on the input node D, the P-type transistor 153a is turned on. A large current can flow through the turned-on P-type transistor 153a, desirably pulling up the voltage level on the storage node $N_2$ to the power source $V_{DD}$.

As noted, the circuit 120 can separately divert the signal $S_{out}$ of the output driver 110 through the path 130 or 140 in response to a low-to-high or high-to-low voltage state transition of the data signal S. In response to the low-to-high or high-to-low voltage state transition of the data signal S, the circuit 120 switches on either the P-type transistor 111 or the N-type transistor 113, but not both. Compared to the conventional latch circuit seeing both gate capacitances of the P-type transistor and the N-type transistor, the latch circuit 100 merely sees a gate capacitance of the P-type transistor 111 or the N-type transistor 113. With a lower gate capacitance, a D-to-Q delay during a transparent phase can be reduced. The reduction of D-to-Q delay can improve speed of the latch circuit 100, which is deployed in an integrated circuit, e.g., a steady logic circuit or a high speed circuit.

Figure 4:
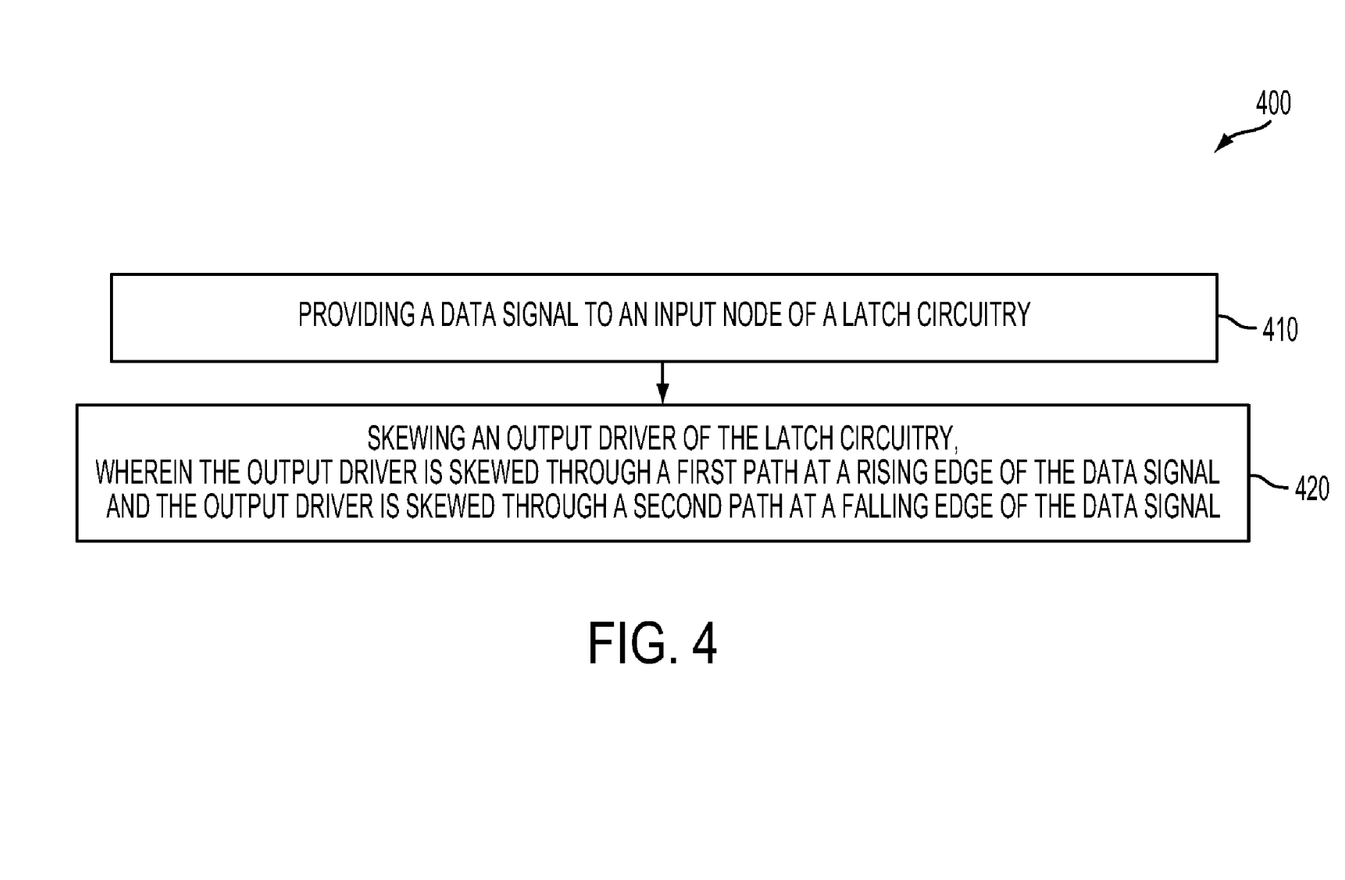
FIG. 4 is a flow chart showing an exemplary method of operating an exemplary latch circuit.

Following are descriptions regarding exemplary methods of operating a latch circuit. FIG. 4 is a flowchart illustrating an exemplary method of operating a latch circuit. In FIG. 4, a method 400 of operating a latch circuit includes providing a data signal to an input node of a latch circuit (block 410). The method 400 also includes diverting the signal of an output driver of the latch circuit (block 420). The method 400 can divert the signal of the output driver through a first path at a rising edge of the data signal. The method 400 can divert the signal of the output driver through a second path at a falling edge of the data signal.

Figure 5:
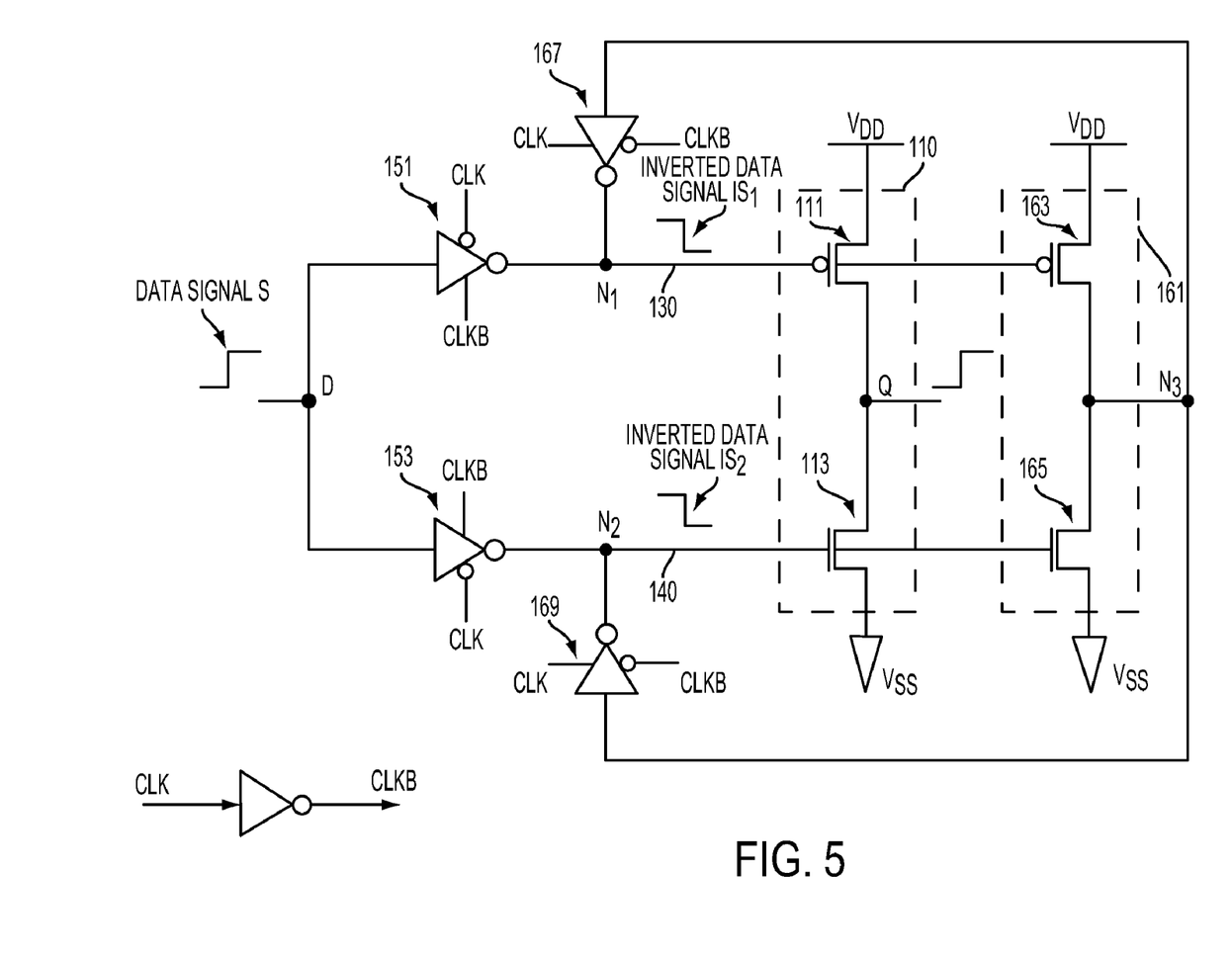
FIG. 5 is a schematic drawing showing an operation of a latch circuit receiving a rising edge of a data signal.

In some embodiments passing a rising edge of the data signal, the input node D can receive a rising edge of the data signal S as shown in FIG. 5. During a D-to-Q transparent phase, clock signals CLK and CLKB can turn on the inverters 151 and 153 and turn off the inverters 167 and 169. The turned-on inverters 151 and 153 can each invert the rising edge of the data signal S to a falling edge of an inverted data signal to the paths 130 and 140, respectively. The falling edge of the inverted data signal $IS_2$ turns off the N-type transistors 113 and 165. The falling edge of the inverted data signal $IS_1$ turns on the P-type transistors 111 and 163. The turned-on P-type transistor 111 can electrically couple the output node Q of the latch circuit 100 with the power source $V_{DD}$, pulling up the voltage level on the output node Q toward the power source $V_{DD}$. As noted, the inverter 167 is turned off, such that the voltage level on the node $N_3$ is not fed back to the storage node $N_1$. The rising edge of the data signal S on the input node D is thus passed to the output node Q.

In some embodiments, the inverter 151 can include the P-type transistor 151a and the N-type transistor 151b as described above in conjunction with FIG. 3A. As noted, the N-type transistor 151b can have a driving ability larger than that of the P-type transistor 151a. In the case that the input node D receives the rising edge of the data signal S, the turned-on N-type transistor 151b can swiftly pull down the voltage level on the storage node $N_1$, such that the inverted data signal $IS_1$ can transition from a high voltage state to a low voltage state in a fast fashion.

Figure 6:
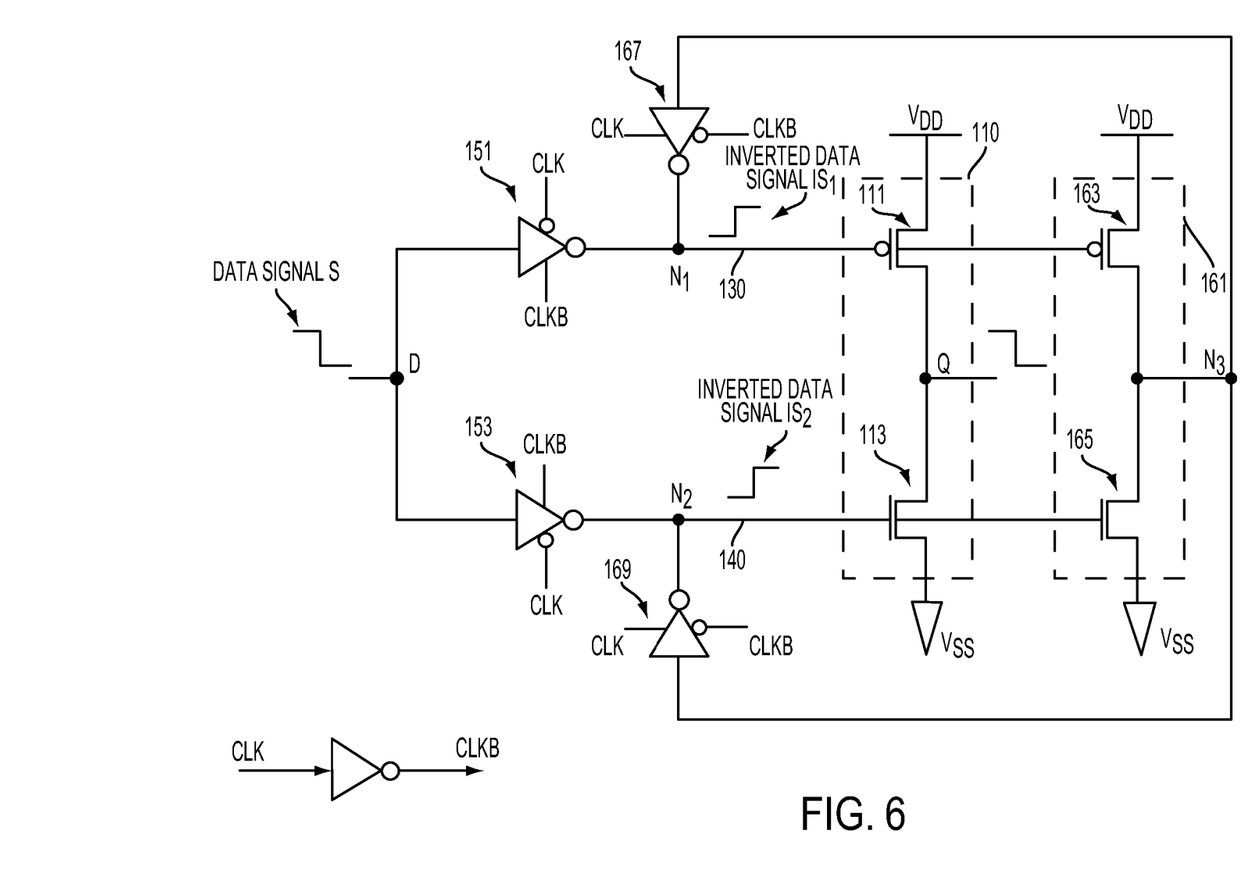
FIG. 6 is a schematic drawing showing an operation of a latch circuit receiving a falling edge of a data signal.

In some embodiments passing a falling edge of the data signal, the input node D can receive a falling edge of the data signal S as shown in FIG. 6. During a D-to-Q transparent period, clock signals CLK and CLKB can turn on the inverters 151 and 153 and turn off the inverters 167 and 169. The turned-on inverters 151 and 153 can each invert the falling edge of the data signal S to a rising edge of an inverted data signal to each of the paths 130 and 140, respectively. The rising edge of the inverted data signal $IS_1$ turns off the P-type transistors 111 and 163. The rising edge of the inverted data signal $IS_2$ turns on the N-type transistors 113 and 165. The turned-on N-type transistor 113 can electrically couple the output node Q of the latch circuit 100 with the power source $V_{SS}$, pulling down the voltage level on the output node Q toward the power source $V_{SS}$. As noted, the inverter 169 is turned off, such that the voltage level on the node $N_3$ is not fed back to the storage node $N_2$. The falling edge of the data signal S on the input node D is thus passed to the output node Q.

In some embodiments, the inverter 153 can include the P-type transistor 153a and the N-type transistor 153b as described above in conjunction with FIG. 3B. As noted, the P-type transistor 153a can have a driving ability larger than that of the N-type transistor 153b. In the case that the input node D receives the falling edge of the data signal S, the turned-on P-type transistor 153a can swiftly pull up the voltage level on the storage node $N_2$, such that the inverted data signal $IS_2$ can transition from a low voltage state to a high voltage state in a fast fashion.

Table I shows simulation results for a conventional latch circuit and the latch circuit 200 described above in conjunction with FIG. 2.

TABLE I

|  | Delay with a rising edge picoseconds (ps) | Delay with a falling edge picoseconds (ps) |
| --- | --- | --- |
| Conventional latch circuit | 95.86 | 94.46 |
| Latch circuit 200 | 87.25 | 86.65 |
| Reduction of delay | 9% | 8% |

The simulations are performed with conditions at a slow-slow (SS) corner. For example, the conventional latch circuit and the latch circuit 200 are designed with a 28-nm technology node. Both the conventional latch circuit and the latch circuit 200 are operated with an operating voltage of about 0.765 V and a temperature of about −40° C. As shown in Table I, the latch circuit 200 has delays less than the conventional latch circuit by about 8% to about 10%.

Figure 7:
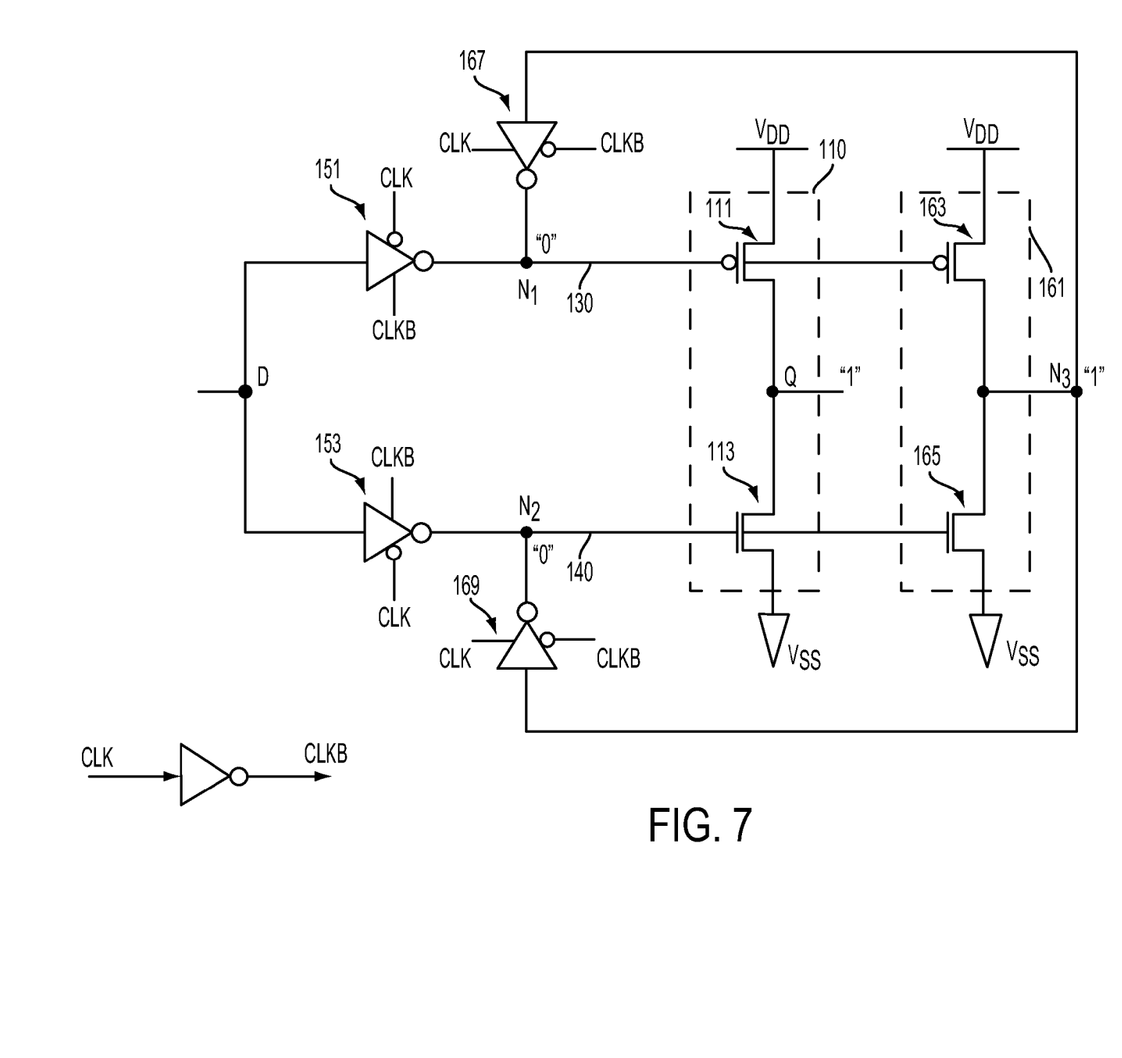
FIG. 7 is a schematic drawing showing an operation of a latch circuit latching a low voltage state "0" on a storage node.

In some embodiments, the method 400 can include latching a low voltage state on a first storage node of the first path during a first latch phase. For example, a low voltage state "0" is on each of the storage nodes $N_1$ and $N_2$ as shown in FIG. 7. During a latch phase to latch the low voltage state "0", clock signals CLK and CLKB turn off the inverters 151 and 153 and turn on the inverters 167 and 169. Because the inverters 151 and 153 are turned off, the data signal S received at the input node D does not pass into the storage nodes $N_1$ and $N_2$. The low voltage state "0" on the storage node $N_2$ can keep the N-type transistors 113 and 165 off. The low voltage state "0" on the storage node $N_1$ can keep the P-type transistors 111 and 163 on. The high voltage state "1" on the node $N_3$ can be fed back to the inverter 167, which in turn inverts the high voltage state "1" to a low voltage state "0" to the storage node $N_1$. The low voltage state "0" thus can be latched on the storage node $N_1$.

Figure 8:
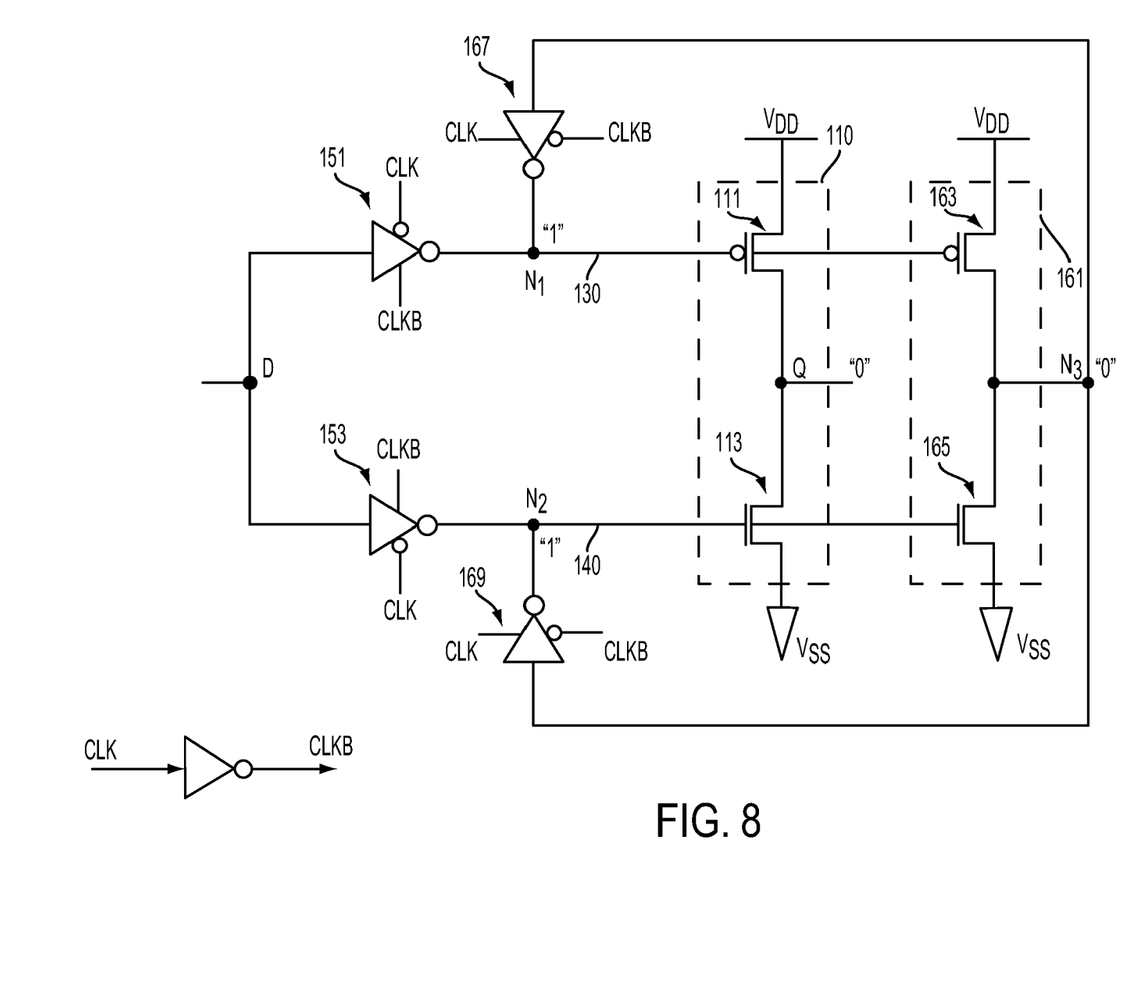
FIG. 8 is a schematic drawing showing an operation of a latch circuit latching a high voltage state "1" on another storage node.

In some embodiments, the method 400 can include latching a high voltage state on a second storage node of the second path during a second latch phase. For example, a high voltage state "1" is on each of the storage nodes $N_1$ and $N_2$ as shown in FIG. 8. During a latch phase to latch the high voltage state "1", clock signals CLK and CLKB turn off the inverters 151 and 153 and turn on the inverters 167 and 169. Because the inverters 151 and 153 are turned off, the data signal S received at the input node D does not pass into the storage nodes $N_1$ and $N_2$. The high voltage state "1" on the storage node $N_1$ can keep the P-type transistors 111 and 163 off. The high voltage state "1" on the storage node $N_2$ can keep the N-type transistors 113 and 165 on. The low voltage state "0" on the node $N_3$ can be fed back to the inverter 169, which in turn inverts the low voltage state "0" to a high voltage state "1" to the storage node $N_2$. The high voltage state "1" thus can be latched on the storage node $N_2$.

In a first exemplary embodiment of this application, a latch circuit includes an output driver electrically coupled with a circuit. The circuit is electrically coupled with the output driver through a first path and a second path. The circuit is configured to receive a data signal. The circuit is configured to divert the signal of the output driver through the first path at a falling edge of the data signal. The circuit is configured to divert the signal of the output driver through the second path at a rising edge of the data signal.

In a second exemplary embodiment of this application, a method of operating a latch circuit includes providing a data signal to an input node of a latch circuit. The method also includes diverting the signal of an output driver of the latch circuit. The method diverts the signal of the output driver through a first path at a rising edge of the data signal. The method diverts the signal of the output driver through a second path at a falling edge of the data signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A latch circuit comprising:
an output driver;
circuit electrically coupled with the output driver through a first path and a second path, the circuit being configured to receive a data signal, the circuit being configured to divert a signal of the output driver through the first path at a falling edge of the data signal, and the circuit being configured to divert the signal of the output driver through the second path at a rising edge of the data signal; and
a feedback loop electrically coupled with a first storage node of the first path and a second storage node of the second path, and the output driver, and configured to transmit a feedback signal to the first storage node during a first latch phase and to the second storage node during a second latch phase.

2. The latch circuit of claim 1, wherein the circuit comprises:
a first inverter electrically coupled with the output driver through the first path, wherein the first storage node is between the first inverter and the output driver, and
a second inverter electrically coupled with the output driver through the second path, wherein the second storage node is between the second inverter and the output driver.

3. The latch circuit of claim 2, wherein the feedback loop comprises:
   a gate of a first P-type transistor electrically coupled with the first storage node;
   a gate of a first N-type transistor electrically coupled with the second storage node;
   a third inverter electrically coupled between the first storage node and a node between the first P-type transistor and the first N-type transistor; and
   a fourth inverter electrically coupled between the second storage node and the node between the first P-type transistor and the first N-type transistor.

4. The latch circuit of claim 2, wherein the first inverter comprises:
   a second P-type transistor, and
   a second N-type transistor, wherein a channel width of the second N-type transistor is larger than a channel width of the second P-type transistor.

5. The latch circuit of claim 2, wherein the second inverter comprises:
   a third P-type transistor, and
   a third N-type transistor, wherein a channel width of the third N-type transistor is smaller than a channel width of the third P-type transistor.

6. The latch circuit of claim 2, wherein the circuit is further configured to latch a low voltage state on the first storage node during the first latch phase and the circuit is further configured to latch a high voltage state on the second storage node during the second latch phase.

7. A latch circuit comprising:
   an output driver;
   a first inverter electrically coupled with the output driver through a first path, wherein a first storage node is between the first inverter and the output driver;
   a second inverter electrically coupled with the output driver through a second path, wherein a second storage node is between the second inverter and the output driver; and
   a feedback loop electrically coupled with the first storage node and the second storage node, and the output driver, and configured to transmit a feedback signal to the first storage node during a first latch phase and to the second storage node during a second latch phase.

8. The latch circuit of claim 7, wherein the feedback loop comprises:
   a gate of a first P-type transistor electrically coupled with the first storage node;
   a gate of a first N-type transistor electrically coupled with the second storage node;
   a third inverter electrically coupled between the first storage node and a node between the first P-type transistor and the first N-type transistor; and
   a fourth inverter electrically coupled between the second storage node and the node between the first P-type transistor and the first N-type transistor.

9. The latch circuit of claim 7, wherein the first inverter comprises:
   a second P-type transistor; and
   a second N-type transistor, wherein a channel width of the second N-type transistor is larger than a width of the second P-type transistor.

10. The latch circuit of claim 7, wherein the second inverter comprises:
    a third P-type transistor; and
    a third N-type transistor, wherein a channel width of the third N-type transistor is smaller than a width of the third P-type transistor.

11. The latch circuit of claim 7, wherein the first inverter is configured to receive a data signal to divert the signal of the output driver through the first path at a falling edge of the data signal and the second inverter is configured to receive the data signal to divert the signal of the output driver through the second path at a rising edge of the data signal.

12. The latch circuit of claim 7, wherein the feedback loop is configured to latch a low voltage state on the first storage node during the first latch phase and the feedback loop is configured to latch a high voltage state on the second storage node during the second latch phase.

13. A method of operating a latch circuit, the method comprising:
    providing a data signal to an input node of a latch circuit; and
    diverting a signal of an output driver of the latch circuit, wherein the signal of the output driver is diverted through a first path at a rising edge of the data signal and the signal of the output driver is diverted through a second path at a falling edge of the data signal: and
    transmitting a feedback signal to the first path during a first latch phase and transmitting the feedback signal to the second path during a second latch phase.

14. The method of claim 13, wherein diverting the signal of the output driver comprises:
    inverting the rising edge of the data signal to divert the signal of the output inverter through the first path.

15. The method of claim 14, wherein diverting the signal of the output driver through the first path comprises:
    switching a P-type transistor of the output driver through the first path.

16. The method of claim 13, wherein diverting the signal of the output driver comprises:
    inverting the falling edge of the data signal to divert the signal of the output inverter through the second path.

17. The method of claim 16, wherein diverting the signal of the output driver through the second path comprises:
    switching an N-type transistor of the output driver through the second path.

18. The method of claim 13, further comprising:
    latching a low voltage state on a first storage node of the first path during the first latch phase.

19. The method of claim 13, further comprising:
    latching a high voltage state on a second storage node of the second path during the second latch phase.

* * * * *